(12) United States Patent
Krylov

(10) Patent No.: US 10,830,988 B2
(45) Date of Patent: Nov. 10, 2020

(54) LATERALLY UNCONSTRAINED MAGNETIC JOINT FOR TIP TILT AND PISTON-TIP-TILT MOUNTS

(71) Applicant: Light Steering Technologies, LLC, Hooksett, NH (US)

(72) Inventor: Vladimir G. Krylov, Brookline, NH (US)

(73) Assignee: Light Steering Technologies, LLC, Hooksett, NH (US)

( * ) Notice: Subject to any disclaimer, the term of this patent is extended or adjusted under 35 U.S.C. 154(b) by 115 days.

(21) Appl. No.: 16/125,758

(22) Filed: Sep. 9, 2018

(65) Prior Publication Data

US 2019/0086634 A1 Mar. 21, 2019

Related U.S. Application Data

(60) Provisional application No. 62/559,610, filed on Sep. 17, 2017.

(51) Int. Cl.
*G02B 26/08* (2006.01)
*G02B 7/182* (2006.01)
(Continued)

(52) U.S. Cl.
CPC ............ *G02B 7/1828* (2013.01); *F16C 11/04* (2013.01); *G02B 7/003* (2013.01); *G02B 7/198* (2013.01);
(Continued)

(58) Field of Classification Search
CPC ...... G02B 7/1828; G02B 7/003; G02B 7/198; F16C 11/04; F16C 2370/20; F16C 2226/18; G03F 7/70825
(Continued)

(56) References Cited

U.S. PATENT DOCUMENTS 5,550,669 A    8/1996   Patel
5,821,655 A * 10/1998   Tokushima ............. F16C 17/10
                                                                                     310/90

(Continued)

FOREIGN PATENT DOCUMENTS

CN       105587757 A    5/2016
EP        2816723      12/2014
(Continued)

OTHER PUBLICATIONS

C. Belly et al., "Long Stroke/High Resolution Tip Tilt Mechanism", Actuator, 14th International Conference on New Actuators, Jun. 2014, Bremen, Germany, 3 pages.
(Continued)

*Primary Examiner* — Euncha P Cherry
(74) *Attorney, Agent, or Firm* — Finch & Maloney PLLC

(57) ABSTRACT

The subject of this invention is a laterally unconstrained magnetic joint and application of said joint in tip-tilt and piston-tip-tilt optical mounts. The laterally unconstrained magnetic joint in its basic embodiment comprises two interfacing parts: one having a flat surface interfacing a convex surface of the other, wherein one or both parts are made from permanent magnets that are magnetized along the axis of the joint, and the other of the said parts is made from a ferromagnetic material thus creating magnetic force attraction between the two parts. The resulting lack of lateral mechanical constraint between the two parts of the joint is utilized in tip-tilt mounts by decoupling an adjustor and/or actuator from the payload resulting in a simple, uniform design, while magnetic force provides retention sufficient for a wide variety of applications.

20 Claims, 4 Drawing Sheets

(51) Int. Cl.
G02B 7/198 (2006.01)
F16C 11/04 (2006.01)
G03F 7/20 (2006.01)
G02B 7/00 (2006.01)

(52) U.S. Cl.
CPC ...... *G03F 7/70825* (2013.01); *F16C 2226/18* (2013.01); *F16C 2370/20* (2013.01)

(58) Field of Classification Search
USPC ...................................................... 359/198.1
See application file for complete search history.

(56) References Cited

U.S. PATENT DOCUMENTS

| 6,566,992 | B1 | 5/2003 | Vicentelli |
| 6,856,437 | B2 | 2/2005 | Witt et al. |
| 8,043,513 | B2 | 10/2011 | Milanovic et al. |
| 2003/0106230 | A1 | 6/2003 | Hennessey |
| 2015/0369418 | A1* | 12/2015 | Wong ................... F16M 11/041 248/372.1 |
| 2018/0095223 | A1 | 4/2018 | Wiley et al. |
| 2019/0086634 | A1 | 3/2019 | Krylov |

FOREIGN PATENT DOCUMENTS

| FR | 3007499 | 12/2014 |
| JP | 2007-032595 A | 2/2007 |
| JP | 2008-023076 A | 2/2008 |
| WO | 2008044229 A1 | 4/2008 |
| WO | 2018064462 A1 | 4/2018 |

OTHER PUBLICATIONS

PCT Search Report and Written Opinion for PCT Application No. PCT/US2019/021286, dated Nov. 18, 2019, 15 pages.

* cited by examiner a) b)

c) d)

LATERALLY UNCONSTRAINED MAGNETIC JOINT FOR TIP TILT AND PISTON-TIP-TILT MOUNTS

FIELD OF THE INVENTION

This disclosure relates generally to the mounting and positioning of optical components, and in particular to mounting and positioning of a mirror or other optical component requiring tip-tilt or piston-tip-tilt adjustments.

BACKGROUND

Optical systems require accuracy and stability in positioning of optical components and in many cases said components must have adjustment capabilities to achieve system performance. In particular, system alignment is often achieved via "pointing adjustment" of reflective components such as mirrors, using mounts with two rotational degrees of freedom around axes perpendicular to reflective surface normal, often termed "tip-tilt".

Conventional approaches for mirror mounting and adjustment include kinematic mounts, flexure mounts, and gimbal mounts. These mounts are often complex and require precision machining. The optical element is usually mounted in a flame putting metal surfaces in close proximity to the retained optic, which can be undesirable in high power laser applications. The additional weight of an optical element retainer makes conventional mounts ill-suited for applications requiring rapid adjustments, such as fast steering mirrors.

Therefore, a need exists for a novel approach to adjustable mirror mount that would address the drawbacks of conventional approaches. Furthermore, a simpler, more compact design and lower cost are the attributes which are always in demand.

BRIEF SUMMARY OF THE INVENTION

This invention comprises a novel method and apparatus for implementing a flexible magnetic joint and application of said flexible magnetic joint in tip-tilt and piston-tip-tilt optical mounts. The invention employs a magnetic joint which, in its basic embodiment, consists of two interfacing parts: one having a flat surface interfacing a convex surface of the other. One or both parts of the magnetic joint are made from permanent magnets which are magnetized along the axis of the joint, or one of the parts is made from a ferromagnetic material thus creating magnetic force attraction between the two parts.

Unlike conventional magnetic joints which utilize matching spherical surfaces and only allowing three rotational degrees of freedom, the magnetic joint of this invention does not mechanically constrain the translational degrees of freedom perpendicular to the joint axis. This feature of the magnetic joint of this invention is critical to its application to tip-tilt mounts. When travel of actuators in a tip-tilt mount is constrained to parallel axes, the distance between points defining the plane of an optical element or its holder is not constant. The magnetic joint of this invention allows for simple, uniform design where the optical element or its mount are decoupled from actuators through the lack of lateral mechanical constraint between the two joint components, while magnetic force provides retention sufficient for wide variety of applications.

BRIEF DESCRIPTION OF THE DRAWINGS

Embodiments of the present invention are illustrated as examples and are not limited by the figures of the accompanied drawings, in which like reference may indicate similar elements and in which.

DETAILED DESCRIPTION OF THE INVENTION

The terminology used herein is for the purpose of describing particular embodiments only and is not intended to limit the invention. The term "and/or" includes any and all combinations of one or more of the associated listed items. The singular forms "a", "an", and "the" are intended to include the plural forms as well as singular forms, unless the context clearly indicates otherwise. It will be further understood that the terms "comprises" and/or "comprising", when used in this specification, indicate the presence of stated features, elements, and/or components, but do not preclude the presence or addition of one or more other features, elements, components, and/or groups thereof.

The present disclosure is to be considered as an exemplification of the invention, and is not intended to limit the invention to the specific embodiments illustrated by figures or description below.

Figure 1:
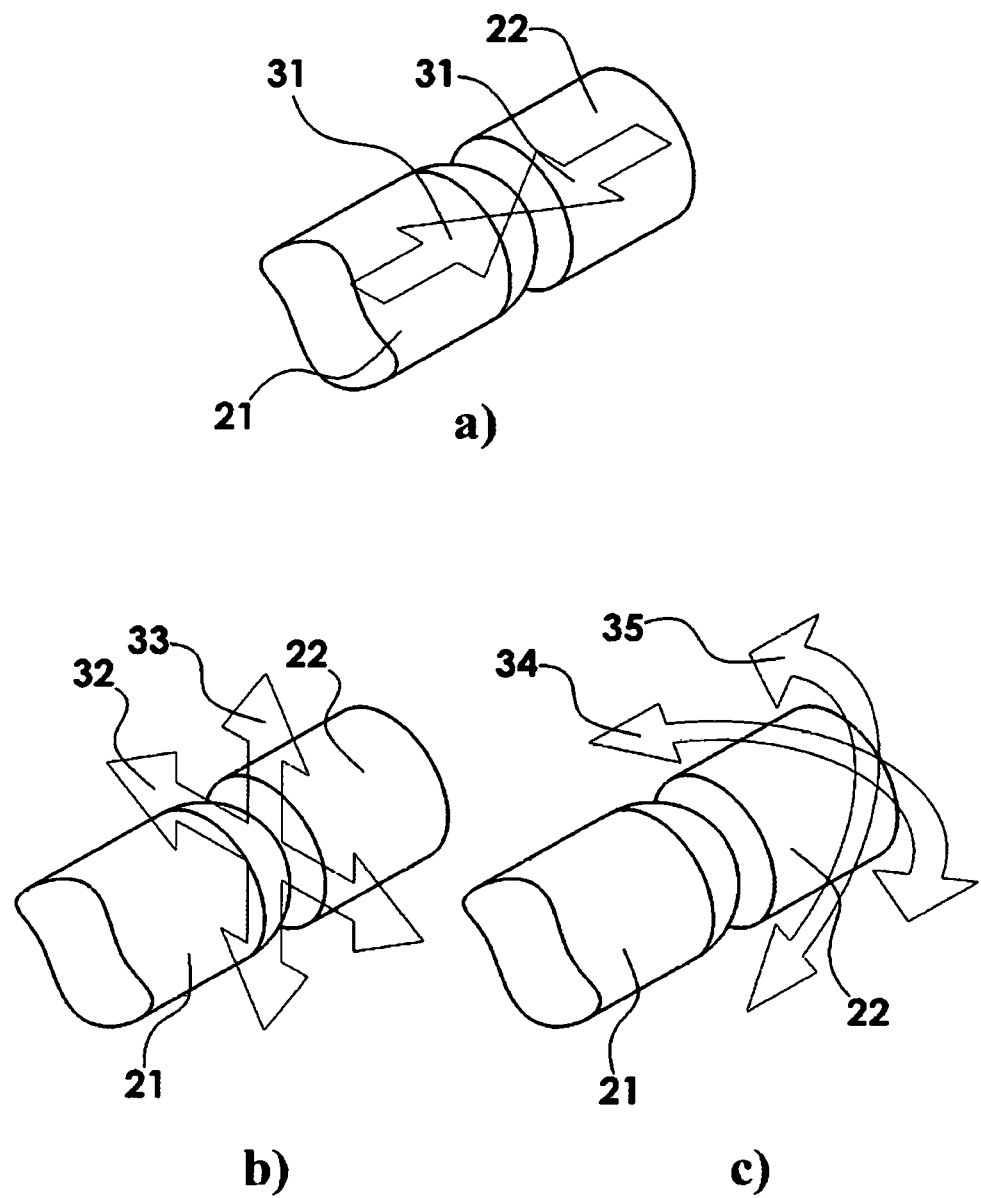
FIG. 1 depicts a perspective view of the basic embodiment of the laterally unconstrained magnetic joint and its degrees of freedom.

The present invention will now be described by referencing the appended figures representing preferred embodiments. FIG. 1 depicts a perspective view of the basic embodiment of the laterally unconstrained magnetic joint (the "joint"). The joint consists of two components 21 and 22 interfacing each other: one component 22 having a flat interface surface, and the other component 21 having a convex interface surface.

One embodiment of the joint comprises both components 21 and 22 made from a permanent magnet material magnetized in the same direction along the joint axis 31. Another embodiment of the joint comprises one component made from a permanent magnet material and another from a ferromagnetic material. In both cases there is a magnetic force attracting the two components of the joint together along the joint axis 31 as shown in FIG. 1.a).

By the nature of the interface between the flat and the convex surface the two components 21 and 22 of the joint are free to move laterally as shown in FIG. 1.b). While in most embodiments, the convex surface is expected to be spherical, any other continuous convex surface which allows desired range of tip-tilt motion is within the scope and spirit of this invention. For all possible geometries of the two joint components 21 and 22, there will be a position of one relative to another when the lateral magnetic forces are at equilibrium. For rotationally symmetric embodiments, this condition is satisfied, gravity and other forces not considered, when the symmetry axes of each component are collinear. Lateral displacement 32, 33 of the two components 21 and 22 relative to each other results in magnetic force towards the said equilibrium condition thus providing retention within the joint.

The joint is free to articulate within all three rotational degrees of freedom, the two of which 34 and 35 are around the axes perpendicular to the joint axis 31. The articulation 34 and 35 as shown in FIG. 1.*c*) is limited by the extent of the convex surface of the joint component 21.

Figure 2:
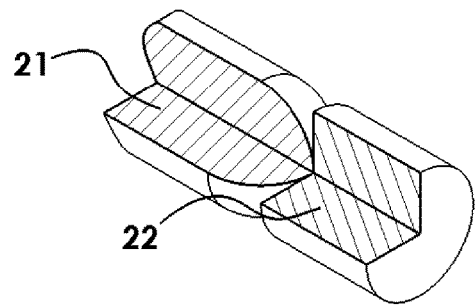
FIG. 2 shows perspective views with quarter sections of possible embodiments of the laterally unconstrained magnetic joint.
Figure 2:
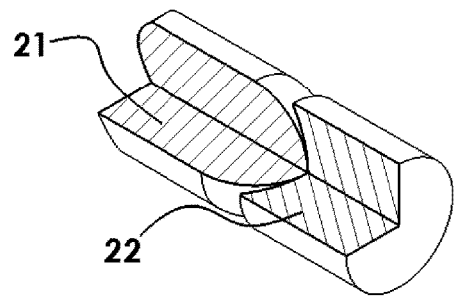
Figure 2:
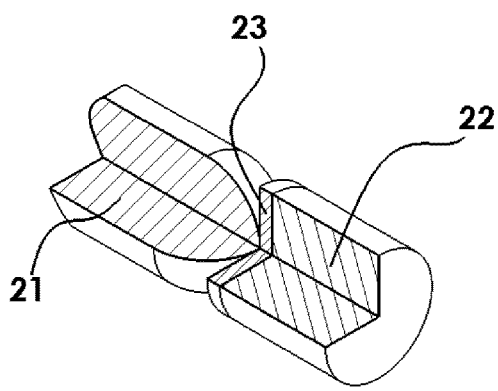
Figure 2:
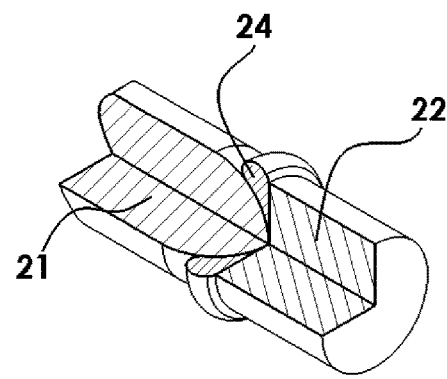

Examples of the joint embodiments are depicted in FIG. 2. The basic joint embodiment as described in previous paragraphs is shown in FIG. 2.*a*). FIG. 2.*b*) depicts an example of embodiment where the joint interface surfaces are concave and convex with convex having a greater curvature so that lateral motion of the joint is permitted. In general, this invention covers embodiments of any surface pair configuration that permits lateral motion between the two joint components 21 and 22.

In another embodiment the joint may have a component 23 as shown in FIG. 2.*c*) that improves bearing properties of the joint. Such component 23 may float between the two joint components 21 and 22, be attached to one of the joint components, or be a surface coating of either or both joint components 21 and 22.

In another embodiment the joint may include ferromagnetic fluid ("ferrofluid") 24 as shown in FIG. 2.*d*), which can be used to increase the magnetic force attracting the two joint components together, and/or improve the bearing properties by lubricating the interfacing surfaces of the joint.

Figure 3:
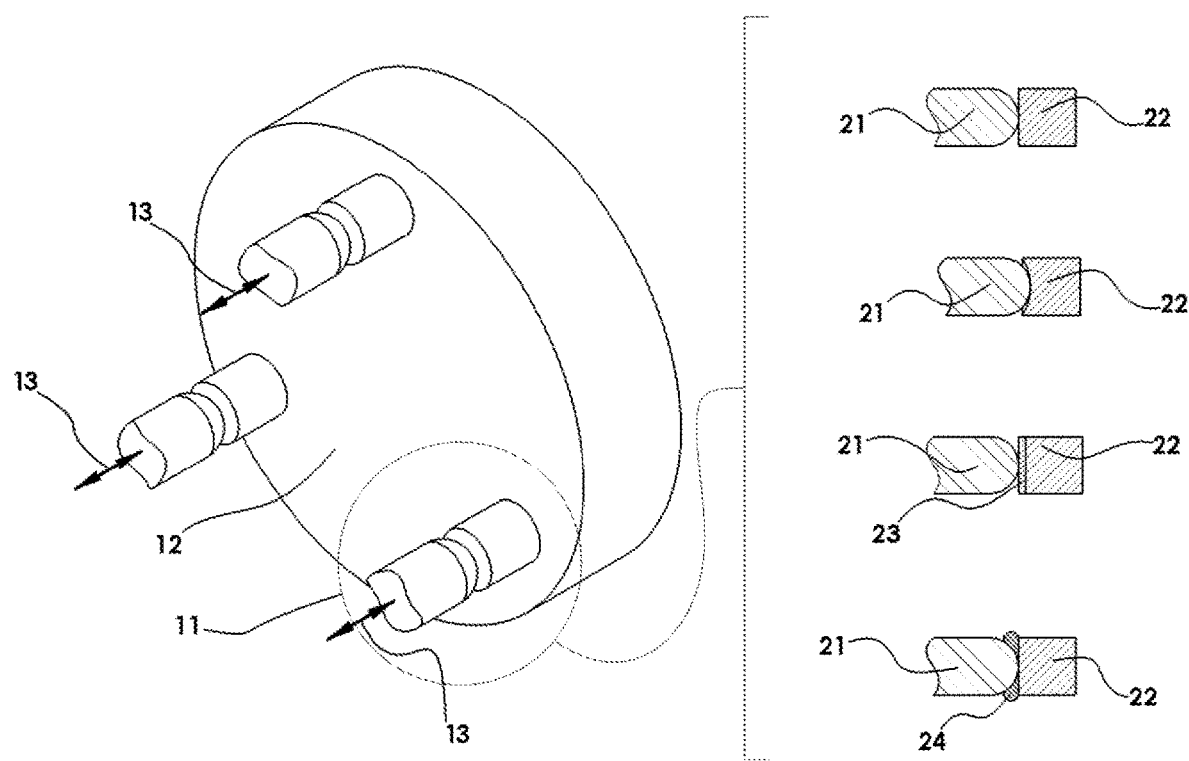
FIG. 3 shows a perspective view of an example of a mirror mount embodiment with side section views of the possible laterally unconstrained magnetic joint embodiments.

An example of a mirror mount embodiment utilizing the laterally unconstrained magnetic joint ("mount") is depicted in FIG. 3. The mount would utilize three joints 11 arranged in any configuration other than a line, thus defining a plane with three points in space. On one side, all three joints 11 would interface a mirror, mirror mount, or any other type of payload 12. This interface can have numerous embodiments, which are outside of the scope of this invention. On the other side of the joint, an embodiment of an optical mount providing piston-tip-tilt functionality would have all three joints 11 interfacing an adjustor or linear actuator 13; and an embodiment of an optical mount providing tip-tilt functionality would have two joints 11 interfacing an adjustor or linear actuator 13, while the third joint 11 will be statically attached to a reference point.

Embodiment of adjustors and linear actuators 13 is outside of the scope of this invention and can be any combination of manual or motorized types including but not limited to: screws, fine-pitch screws, micrometers, differential screws, piezo actuators, leadscrews, ball-screws, roller screws, rack and pinions, chain drives, belt drives, hydraulic, pneumatic, voice-coils, linear drives, etc.

Figure 4:
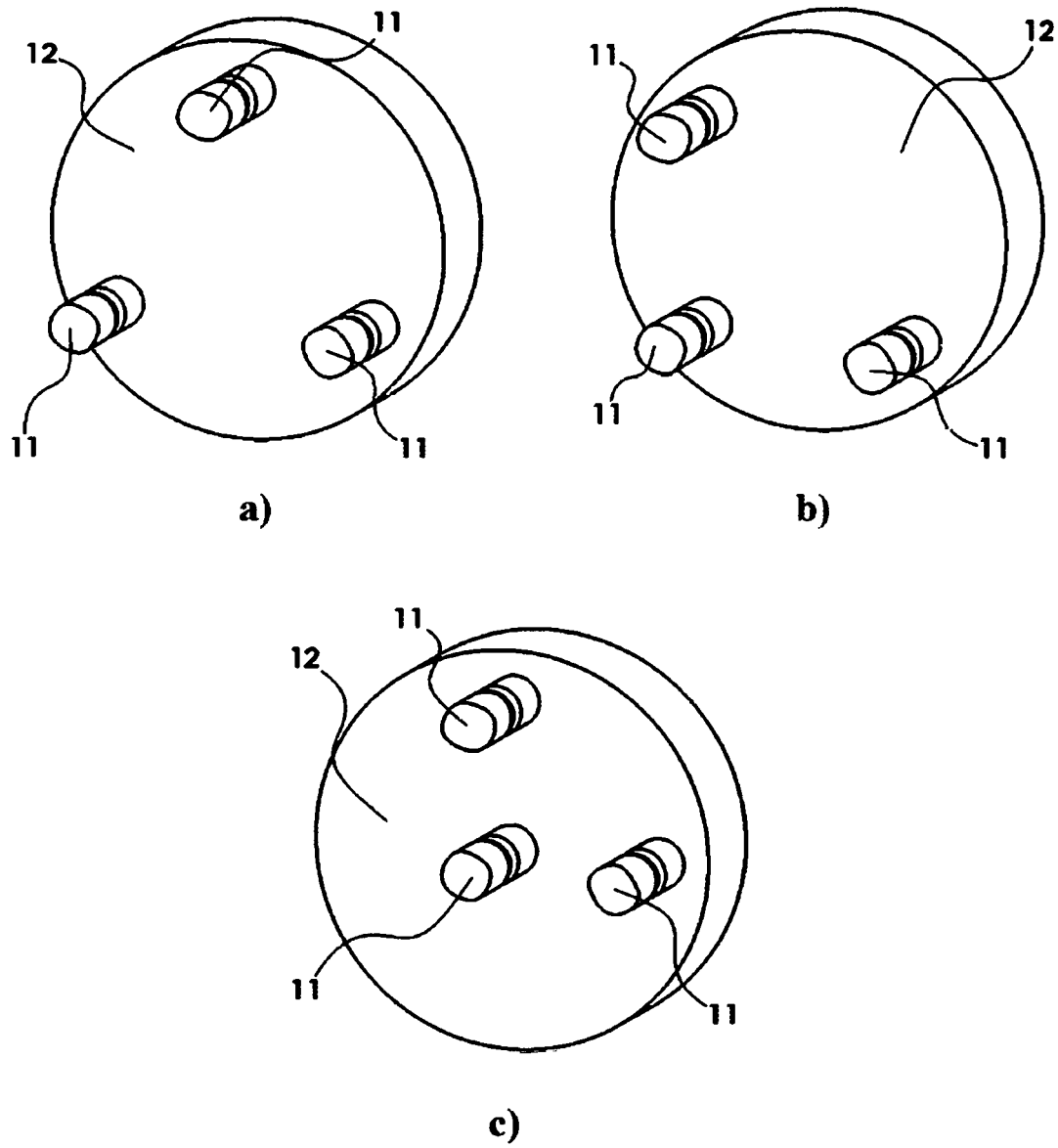
FIG. 4 shows perspective views of possible laterally unconstrained magnetic joint arrangements when used in mirror mount embodiments

While most embodiments are expected to have the adjustors and linear actuators 13 act along parallel axes, other embodiments may have different configurations. As long as such embodiments utilize the laterally unconstrained magnetic joint as described by this invention to decouple the adjustment and/or actuation mechanism from the mirror, mirror mount, or any other type of payload, they are within the scope and spirit of this invention Examples of embodiments of an actuator 13—joint 11 arrangements within a mount are shown in FIG. 4. Equilateral triangle arrangement shown in FIG. 4.*a*) provides symmetrical mounting of the payload, equalizing the forces seen by joints 11 under uniform operating conditions. The drawback of equilateral arrangement is non-orthogonal actuation during adjustment. Orthogonal arrangement depicted in FIG. 4.*b*) is functionally equivalent to conventional tip-tilt mounts which utilize cone, groove, and flat constraint systems. Another embodiment shown in FIG. 4.*c*) is close functional equivalent of gimbal mounts, which minimize path length variation during adjustment.

Although this invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of this invention, are contemplated thereby, and are intended to be covered by the following claims.

What is claimed is:

1. A laterally unconstrained magnetic joint comprising: a first part comprising a first permanent magnet material, and a second part comprising a second permanent magnet or a ferromagnetic material, wherein the first part and the second part interface by interface surfaces of different curvature permitting lateral translation of the first part relative to the second part, wherein the first part and the second part are attracted to one another by the means of magnetic force along a joint axis intersecting the interface surfaces, and are otherwise free to articulate relative to each other within the constraints of said interface surfaces.

2. The laterally unconstrained magnetic joint of claim 1 further comprising: an interface component disposed between the interface surfaces of the first part and the second part, wherein the interface component improves one or more bearing properties of the joint interface.

3. The laterally unconstrained magnetic joint of claim 1 further comprising: a part or parts encapsulating one or both interface surfaces of the first part and the second part, wherein the part or parts improve one or more bearing properties of the interface surfaces.

4. The laterally unconstrained magnetic joint of claim 1 further comprising: a ferromagnetic fluid between the interface surfaces, wherein said fluid enhances the magnetic force between the two articulating sides of the joint, or improves one or more bearing properties of the interface surfaces.

5. A mount comprising:
   a. a payload,
   b. three (3) laterally unconstrained magnetic joints of claim 1,
   c. a reference body, and
   d. one (1) to three (3) adjustment means,
   wherein the laterally unconstrained magnetic joints are arranged in a pattern that does not form a line, the adjustment means are applied to adjust one (1), two (2), or three (3) of the laterally unconstrained magnetic joints relative to the reference body, and the rest of the joints, if any, are statically attached to the reference body.

6. The mount of claim 5 further comprising a ferromagnetic fluid disposed between interface surfaces of each of the three laterally unconstrained magnetic joints.

7. The laterally unconstrained magnetic joint of claim 2, wherein the interface component includes at least one of (i) a surface coating on the first part, (ii) a surface coating on the second part, and (iii) a ferrofluid between the interface surfaces.

8. The laterally unconstrained magnetic joint of claim 1, wherein the joint axis is perpendicular to the interface surfaces.

9. The laterally unconstrained magnetic joint of claim 1, wherein the second part comprises the second permanent magnet.

10. The laterally unconstrained magnetic joint of claim 9, wherein the first permanent magnet is magnetized along a first axis extending through the first part, the second permanent magnet is magnetized along a second axis extending through the second part, and the magnetic joint is biased towards an equilibrium position in which the first axis, the second axis, and the joint axis are collinear.

11. The laterally unconstrained magnetic joint of claim 10, wherein the first axis is a first axis of symmetry and the second axis is a second axis of symmetry.

12. The laterally unconstrained magnetic joint of claim 10, wherein when the first part is laterally displaced relative to the second part, a magnetic force biases the magnetic joint towards the equilibrium position.

13. The laterally unconstrained magnetic joint of claim 1, wherein the first part has a planar first interface surface and the second part has a convex second interface surface.

14. The laterally unconstrained magnetic joint of claim 13, wherein the convex second interface surface is hemispherical.

15. A magnetic joint comprising:
a first part having a first interface surface and comprising a permanent magnet magnetized along a first axis intersecting the first interface surface; and
a second part comprising a ferromagnetic material and a second interface in point contact with the first interface surface, wherein an interface of the first interface surface and the second interface surface permits lateral translation of the first part relative to the second part, and wherein the first part and the second part are attracted to one another by the means of magnetic force along a joint axis intersecting the first interface surface and the second interface surface.

16. The magnetic joint of claim 15, wherein one of the first interface surface and the second interface surface is planar and the other of the first interface surface and the second interface surface is convex.

17. The magnetic joint of claim 16, wherein the permanent magnet is a first permanent magnet and wherein the second part comprises a second permanent magnet magnetized along a second axis intersecting the second interface surface.

18. The magnetic joint of claim 17, wherein the first axis is a first axis of rotational symmetry and the second axis is a second axis of rotational symmetry.

19. The magnetic joint of claim 17, wherein the magnetic joint is biased towards an equilibrium position in which the first axis, the second axis, and the joint axis are collinear.

20. The magnetic joint of claim 15 further comprising a surface coating on one or both of the first interface surface and the second interface surface, the surface coating configured to improve bearing properties of the joint relative to the first interface surface and the second interface surface without the surface coating.

* * * * *